United States Patent

[11] 3,588,777

[72] Inventor Walter H. Schroen
Dallas, Tex.
[21] Appl. No. 744,826
[22] Filed July 15, 1968
[45] Patented June 28, 1971
[73] Assignee Texas Instruments Incorporated
Dallas, Tex.

[54] SUPERCONDUCTING TUNNELING BARRIERS
32 Claims, 11 Drawing Figs.

[52] U.S. Cl. .......... 338/32, 307/245, 307/306
[51] Int. Cl. .......... H01c 7/16, H01v 11/02
[50] Field of Search .......... 338/32; 307/306, 212, 245

[56] References Cited

UNITED STATES PATENTS 3,281,609 10/1966 Rowell .......... 307/245
3,366,519 1/1968 Pritchard, Jr. et al. .......... 338/32X

OTHER REFERENCES

" The Tunnelling Cryotron— A superconductive Logic Element Based On Electron Tunneling," by J. Matisoo, Proc. IEEE, Vol. 55, No. 2, February, 1967.

*Primary Examiner*—Richard A. Farley
*Assistant Examiner*—Richard E. Berger
*Attorneys*—Samuel M. Mims, Jr., James O. Dixon, Andrew M. Hassell, Harold Levine, James C. Fails, Melvin Sharp and Richards, Harris and Hubbard

ABSTRACT: Apparatus and the method of interconnecting superconducting tunneling barriers formed on an insulating substrate by photographic techniques. Metal strips deposited on the insulating substrate serve as the two superconductors of a sandwich configuration separated by an insulating tunneling barrier. To form a typical barrier array, the first superconductors are deposited and covered with a photoresist. A window is opened in the photoresist at each of the first conductors for fabrication of the barriers. A barrier is then formed on each of the first superconductors in the window area by an oxidation process to form what is commonly known as a "Josephson barrier." The second superconductor for each barrier of the array is then deposited on top of the photoresist material. Appropriate tailoring of the photoresist material forms "-waveguides" that interconnect the barriers into groups. Radiation from one barrier of a group travels through the waveguide photoresist to affect the voltage and current profile of an interconnected barrier.

Patented June 28, 1971 3,588,777

2 Sheets-Sheet 1

Figure 1:
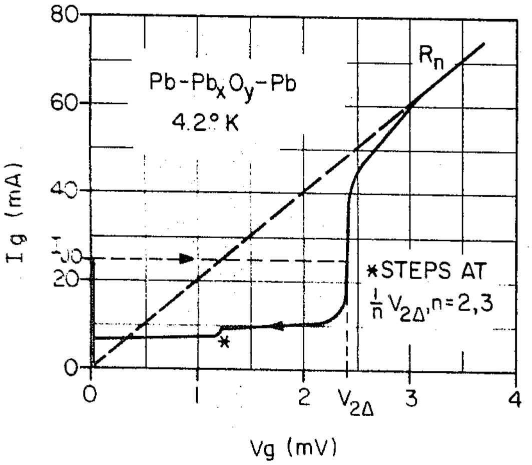

INVENTOR:

WALTER H. SCHROEN

Harold C. Meier

ATTORNEY

INVENTOR

WALTER H. SCHROEN

Harold E. Meier

ATTORNEY

SUPERCONDUCTING TUNNELING BARRIERS

This invention relates to superconductive tunneling barriers, and more particularly, to the high speed transmission of radiation from one superconductive tunneling barrier to others in an array or to barriers in other arrays.

In 1962, in a paper entitled "Possible New Effects in Superconductive Tunneling," pages 251 to 253 of the July 1, 1962 issue of "Physics Letters," B. D. Josephson described the phenomena of supercurrent tunneling through a barrier separating two superconductors. In addition, Josephson predicted oscillating currents, accompanied by photon emission, would be generated when a potential difference is sustained between the two sides of a barrier. Other investigators, such as B. W. Anderson and J. F. Rowell, observed and characterized the DC Josephson effect. Oscillating currents, commonly known as the AC effect, were first observed by I. K. Yanson et al., in 1965, although much indirect experimental support has established the existence of such currents prior to this date. Parallel to these experimental efforts, theoretical investigations elucidated both the DC and AC phenomena.

Heretofore, a tunneling barrier was fabricated by depositing the superconductors in sequence, as strips, upon a dielectric substrate. The surface of the first deposited superconducting strip is oxidized in a room ambient before deposition of the second strip, thus providing the necessary insulating barrier between the strips. Barriers prepared in this manner have been employed in logic circuits such as described in the U.S. Pat. No. 3,281,609 and made use of the DC Josephson effect. However, the AC Josephson effect. However, the AC Josephson effect has not found widespread utilization primarily due to the difficulty of coupling the emitted radiation from a barrier to a utilization device. This difficulty of coupling the emitted radiation was one of the major obstacles that had to be overcome before this phenomena could be observed experimentally.

A tunneling barrier prepared in accordance with the present invention has an oxide layer between superconducting metal layers for generating the micrometer radiation, plus a tailored waveguide (e.g. a photoresist layer) for transmitting the radiation. In the past, experimenters working with tunneling barriers have attempted to use nondielectric, rectangular waveguides to transmit the emitted radiation from the barrier. Because of the low power available ($10^{110}$ to $10^{15}$ watts) and the impedance mismatch (as poor as $10^{110}$) between the barrier and the waveguide, this technique proved to be extremely troublesome, and produced results of questionable accuracy. Of more importance, it effectively prevented useful application of the AC Josephson effect. While intrinsic limitations coming from the self-screening effect will always keep the output power at a low level, much can be done to reduce the impedance mismatch.

In accordance with the present invention, AC radiation in a tunneling barrier may be effectively coupled to a utilization device, such as another tunneling barrier. This coupling results from minimizing the impedance mismatch between the barrier edge and the adjoining waveguide material (e.g. a photoresist layer). Where two barriers are coupled together in accordance with the teachings of this invention, the AC radiation produced in one barrier may be coupled to another barrier to affect the operation thereof as will be described.

In accordance with one aspect of this invention, a first array of superconductors is deposited on an insulating substrate and covered with a photoresist material. Windows are etched in the photoresist at each superconductor where a barrier is to be formed. Oxide barrier layers are produced on the superconductors by ion bombardment of the window areas in the photoresist material after a preparation process which includes cleaning the metal surface of the superconductor. After the barrier growth, a second array of superconductors is evaporated onto the photoresist material and oxide layer to complete a superconductive tunneling device at each window area. By patterning the photoresist layer, radiation from one barrier can be efficiently coupled to one or more surrounding barriers and blocked from other barriers in the array.

One application of the barrier arrays of the present invention is in a computer memory wherein switching times are of utmost importance. The AC Josephson effect is a radiated effect (microwave and far infrared regions) that provides extremely fast interarray coupling (a transmission speed of roughly ½c., where $c$ represents the speed of light and is equal to $3\times10^{10}$cm. sec.$^{11}$) and, consequently, only very small L/R losses in interarray information transfer. A characteristic of a superconducting tunneling barrier that exhibits the Josephson effect is that the radiation transferred from one barrier, by means of a waveguide, to another barrier causes the radiation frequency of the first barrier to be superimposed on the radiation frequency of the second barrier, thereby changing its frequency. This produces a frequency modulation which shows up as a voltage modulation across the second barrier which can be sensed and used for calculating operations.

To produce efficient interarray coupling between superconducting tunneling devices, it is an object of this invention to mitigate the impedance mismatch between the barrier and the coupling waveguide. Another object of this invention is to provide a coupling between superconducting tunneling barriers having a time constant not much larger than the subnanosecond switching times of the barriers. A further object of this invention is to provide a process for producing arrays of interconnected superconducting tunneling barriers. Yet another object of this invention is to provide a process for producing superconducting tunneling barrier array connections wherein the radiation from one barrier may be transmitted to a second barrier to affect the operation thereof.

A more complete understanding of the invention and the advantages thereof will be apparent from the specification and claims and from the accompanying drawings illustrative of the invention.

Figure 2:
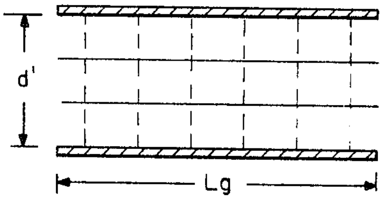
Figure 3:
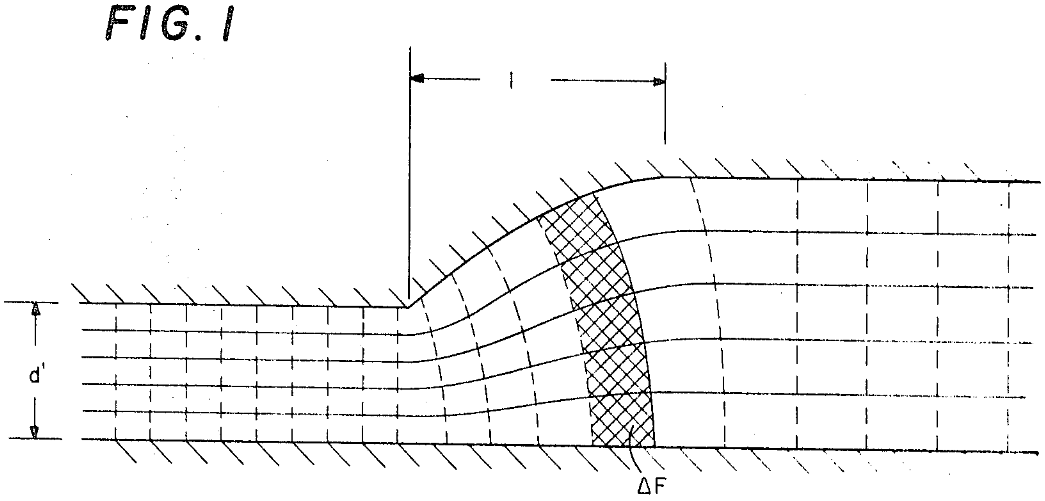
Figure 4A:
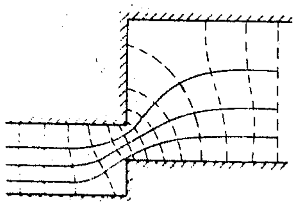
Figure 4B:
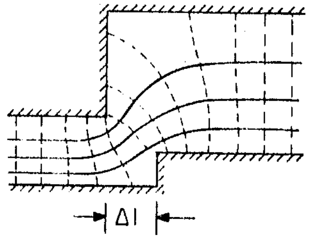
Figure 5A:
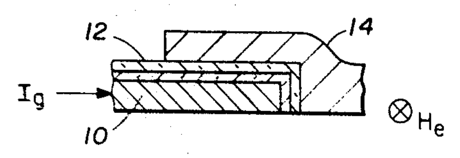
Figure 6A:
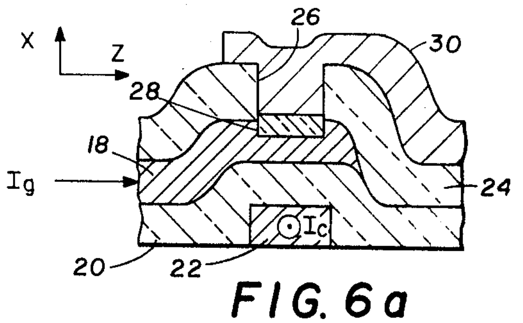
Figure 5B:
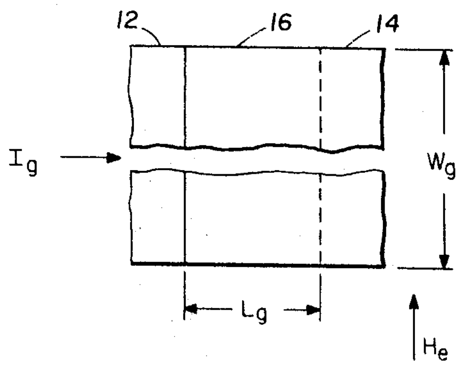
Figure 6B:
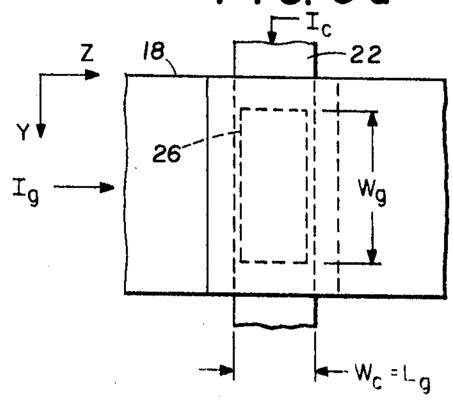
Figure 7:
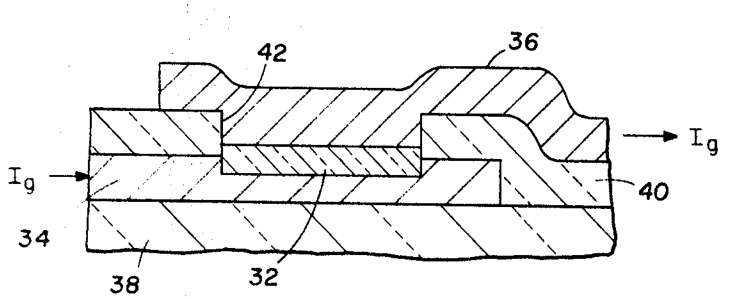
Figure 8:
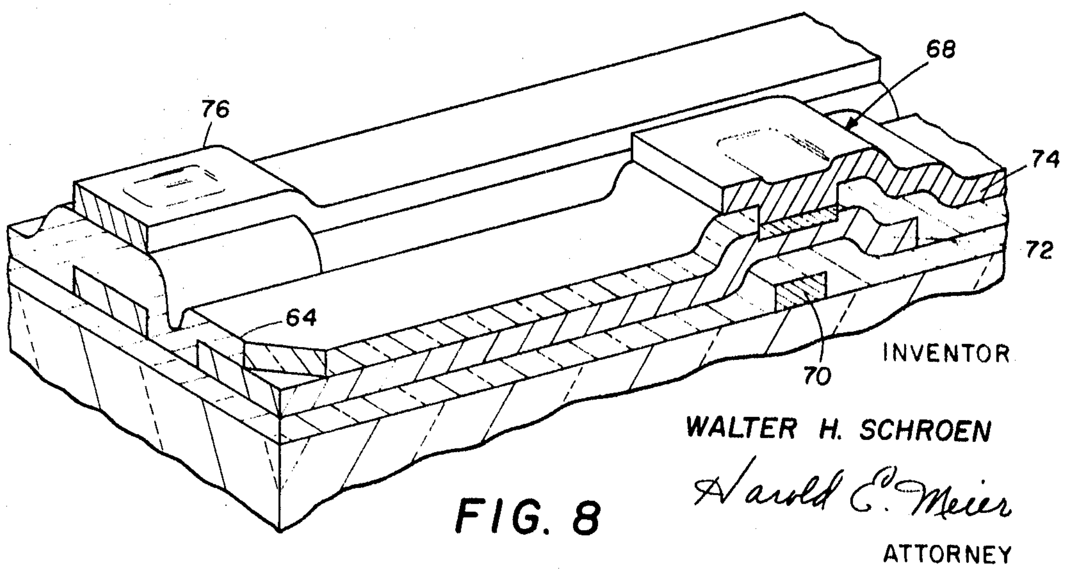

Referring to the drawings:

FIG. 1 illustrates the I–V characteristics of a Josephson effect tunneling barrier, FIG. 2 illustrates schematically a scatter free waveguide, FIG. 3 illustrates a nonhomogeneous band-shaped waveguide sectioned into strips of area $\Delta F$, FIGS. 4*a* and 4*b* are schematic illustrations of electric and magnetic field lines at abrupt changes of cross section between two waveguides, FIGS. 5*a* and 5*b* illustrate a superconducting tunneling barrier produced by a prior art method, FIGS. 6*a* and 6*b* illustrate schematically a superconducting tunneling barrier produced in accordance with the present invention, FIG. 7 shows a cross section of a superconducting tunneling barrier produced in accordance with the method of this invention, and FIG. 8 is an isometric cross section showing two superconducting tunneling barriers interconnected.

Referring to the FIGS., a suitable junction for the purpose of practicing the present invention is a lead-insulator-lead ($Pb-PbXO_y-P_b$) junction on a glass substrate. In the article previously referred to, B. D. Josephson predicted a supercurrent (zero voltage current) will flow across an energy barrier inserted between two superconductors. This supercurrent results from the nondissipative tunneling of electron pairs (Cooper-pairs) from one superconductor to the other through the barrier with no voltage drop across the barrier, provided the structure is maintained below the superconducting transition temperature $T_c$. For lead superconductors, the critical temperature is approximately 7.2° K. and the Josephson effect is readily observed at 4.2° K., the temperature of liquid helium.

A typical plot of the well-known tunneling characteristic of a superconducting barrier is traced by an X–Y plotter as shown in FIG. 1. Plotted is the tunneling current $I_o$ versus the voltage $V_o$ across a tunneling barrier. Strictly speaking, the symbol $I_o$ represents the tunneling zero voltage current $I_J$ up to the maximum value $I_{JO}$, while current values above $I_{JO}$ are caused by tunneling quasi-particle current. The origin and detailed shape of the hysteresis loop are still under discussion. Basically, it is determined by the quasi-particle tunneling, although effects of power dissipation in the barrier layer may also play an important role.

According to Josephson's theory, the supercurrent density $j$ determining $I_j$ is expressed by:

$$j=(2e/\hbar)(\delta/\delta\Phi)(f) \qquad (1)$$

where $e$ = elementary charge ($1.602\times10^{119}$ Coulombs),
= Planck's quantum/$2\pi$ ($6.624\times10^{127}$ erg sec/$2\pi$),
$f$ = a function dependent on the nature of the barrier, and
$\Phi = \psi_1 - \psi_2$ where $\psi_1$ and $\psi_2$ are local values of wave functions.

The supercurrent density $j$ is a harmonic function of the phase difference $\Phi$ as given by the expression:

$$j=j_1 \sin\Phi \qquad (2)$$

where the maximum current density is expressed by:

$$j_1=(\pi/2R_n)\,[\Delta(T)/ea0]\tan h[1/2\,\beta\Delta(T)], \qquad (3)$$

where $R_N$ = the normal state tunneling resistance of 1cm.$^2$,
$\Delta(T)$ = the energy gap,
$\beta=1/kT$, and
$\tan h \cong 1$ at $T/T_c$ less than 0.5.

The value of $V_g$ that first appears across a tunneling barrier is determined by the voltage of twice the superconducting energy gap of the superconducting metal and is thus a material constant; for $Pb$ on both sides of the barrier at a temperature of 4.2° K., $V_{2\Delta}$=2.4 mV.

In addition to DC supercurrents, Josephson also predicted that an AC supercurrent should be present in a superconducting barrier when biased at a finite voltage. A momentary voltage difference that occurs across a superconducting barrier when an external current source is connected thereto initially produces a time independent phase difference when a direct current flows in the junction. This phase difference $\Phi$ shifts in time as a result of the voltage drop and continues to shift until it obtains a value that corresponds to the current that would normally be established by the current source. At this point the voltage drop vanishes, and a zero-voltage current flows through the barrier. This happens in about $10^{111}$ seconds. If the current source forces the current to exceed $I_{JO}$, however, a voltage appears across the superconductor barrier with a corresponding relative phase increase which is steady with time. Because of the sinusoidal dependence of $j$ and $I_{JO}$ on the phase, the current oscillates back and forth between the two superconductors at a frequency proportional to the voltage across the junction. With a nonzero potential difference, V (both AC and DC), between the two sides of the barrier, electron pairs on different sides of the barrier have energies differing by $\Delta E=2eV$ (the charge of one pair being $2e$). In such a system there are oscillating currents at a frequency given by the expression:

$$\nu=2eV/\hbar. \qquad (4)$$

The ratio $2e/\hbar$ in the above equation numerically equals 483.6MHz. per $\mu$ volt. At liquid helium temperatures at a voltage $V_g$ equal to $1/2V_{2\Delta}$ (1.2mV. for $Pb$), this produces a frequency of $\nu$=580.3 GHz. This radiation is in the far infrared region with a wavelength in vacuum of $\lambda_{vac}=5.166\times10^{12}$cm.

For a constant bias voltage, the AC radiation emitted from a superconductive tunneling barrier is expected to be coherent, although not necessarily monochromatic. The upper frequency limit will be determined by the onset of internal absorption due to a process in which a Cooper-pair converts to two normal electrons with the required energy supplied by absorption of a photon. This onset occurs when the bias voltage is such that $h\nu=2\Delta(T)$, i.e., when $eV=\Delta(T)$. Well below the critical temperature, $T_c$, the upper frequency limit for lead will be approximately equal to 650 GHz.

By treating the barrier as a strip line having a characteristic impedance $Z_J$, the power radiated into a waveguide which is terminated by its characteristic impedance $Z_G$ can be estimated. Since the effective reactance associated with the local field modes at the edge of the barrier are small, the transmission coefficient from the barrier to the waveguide is given by the expression:

$$\theta=4Z_GZ_J/(Z_G+Z_J)^2. \qquad (5)$$

If the barrier has a length $L_g$(typically between 10 and 150 micrometers) and an average electromagnetic energy $\mu$ stored in a given excitation mode, then the power at the ends of the barrier will be $v_\epsilon\mu/L_g$, where $v_\epsilon$ is the phase velocity of the wave in the direction of $L_g$in a barrier of dielectric constant $\epsilon$ ($v_\epsilon=v_{vac}/\sqrt{\epsilon}$ For a lead oxide barrier, the dielectric constant $\epsilon=26$ and $v_\epsilon$is approximately equal to $0.196v_{vac}$. The power radiated from a barrier may be obtained by multiplying the power at the ends of the barrier by the transmission coefficient $\theta$ of the waveguide in accordance with the expression:

$$P_{rad.}=(v_\epsilon\mu/L_g)\theta \qquad (6)$$

Depending on the impedance match of $Z_g$ and $Z_J$, experimental values of the radiated power $P_{rad.}$ range from $10^{112}$ to $10^{15}$ watts.

The characteristic impedance of a superconducting barrier may be calculated from the formula:

$$Z_J=\sqrt{L_{ind}/C_J} \qquad (7)$$

where $L_{ind}$ = the inductance per unit length of the barrier, and $C_J$ = the capacitance per unit length of the barrier. Due to the extremely thin configuration of a barrier (thickness approximately 10A., or $10^{17}$ centimeters), the capacitance per unit length is large (between 0.3 to 30 nanofarads). At an oscillating current of frequency $\nu$ of approximately 600 GHz. and an alternating voltage of 0.1 microvolts, the available energy per second from a barrier is on the order of $C\,\nu V^2=10^{110}$ watts.

Because of the very low power levels available, it is very important that the impedance mismatch between the barrier and the waveguide be minimized to minimize the power loss. Like all electromagnetic waves, the AC radiation has a certain penetration depth, $\lambda$, (for $Pb$ the penetration is approximately 400 A.) into the superconducting material. Thus, the actual area of contact between the AC radiation and the waveguide is considerably larger than the actual geometrical contact of about 10 A. Ideally, the impedance match between the barrier and a coupling waveguide should present a minimum of wave reflections. In conventional barrier designs, radiation propagating in the barrier is almost entirely reflected back when it reaches the barrier ends, and very little (about $10^{15}$) is radiated out to the waveguide. A sandwich-type barrier produced in accordance with the present invention is well suited to solve this problem.

Inasmuch as impedance matching is of considerable interest, several basic considerations about impedance matching will be mentioned. The wave impedance $Z_G$ of a band-shaped waveguide without scattering at the ends, as shown in FIG. 2, is given by the equation:

$$Z_G=(\mu_0/\epsilon_0)^{1/2}d/L_g \qquad (8)$$

where $\mu_0$ = free space permeability ($4\pi\times10^{19}$ volt seconds/ampere centimeter), $\epsilon_0$ = vacuum dielectric constant ($1/3.6\pi$) $\times 10^{-12}$F/centimeters), and $d'$ and $L_g$ are the waveguide dimensions. Using the above value of free phase permeability and the vacuum dielectric constant, the waveguide impedance will be:

$$Z_G=120\pi(d'/L_g)\ [\text{ohms}] \qquad (9)$$

For a waveguide of a dielectric material with a dielectric constant $\epsilon$, the waveguide impedance is obtained from the formula:

$$Z_\epsilon = Z_G\,\epsilon^{1/2} \quad (10)$$

When two waveguides having a resistance to wave propagation $R_1$ and $R_2$, respectively, are to be coupled together to transmit radiation free of reflection, the impedance of the connecting link, that is the interface, is given by the expression:

$$Z_1 = (R_1 \times R_2)^{1/2} \quad (11)$$

The connecting link may have the same dielectric constant as the guides or a different one. In any case, for a given radiation wavelength, the connecting link has an optimum length $l$ as given by the expression:

$$l = 1/4\lambda_\epsilon \quad (12)$$

where $\lambda_\epsilon = \lambda_{vac.}/\epsilon$

To achieve the condition of reflection-free conduction between a radiation source and the waveguide, the radiation should be transmitted without bends, kinks, or generally inhomogeneous shaped band structures. Referring to FIG. 3, there is shown a somewhat idealized radiation pattern between a source at the left FIG. and a waveguide at the right. The section on the left represents the insulating layer of a Josephson barrier and the section to the right an insulator such as a photoresist. The vertical lines represent electric field lines and the horizontal lines represent magnetic field lines. The impedance of the connecting link, that is, the center section between the barrier oxide and the insulating waveguide, is given by the expression:

$$Z = (\Delta L_{ind}/AFC)^{1/2} = (120\pi/W_o)\,(\Delta F m)^{1/2} \quad (13)$$

where $m$ = the stripe number, $\Delta F$ = the area of one stripe (composed of $m$ squares), $\Delta L_{ind} = (\mu_0/W_o)\,\Delta F$ (the inductance of one stripe), $C = (\epsilon_0/m)\,W_o$ (the capacitance of one stripe), $W_o$ = the width of the barrier perpendicular to the surface shown. For a connecting link with a dielectric constant $\epsilon$, the impedance is given by the expression $Z_\epsilon = Z/\epsilon^{1/2}$ Unfortunately, the ideal situation as illustrated in FIG. 3 is difficult to achieve. The illustrations of FIGS. 4*a* and 4*b* show the usual coupling configurations between a radiation source and a waveguide. The impedance will be large in the corners and small in the narrow channels. The coupling illustrated in FIG. 4*a* is particularly unfavorable. To improve the impedance match for this configuration, the high capacitance of the throat section must be reduced thereby lowering the wave reflections in the waveguide connection. One scheme for reducing the wave reflections is to offset the discontinuity between the source and waveguide by a length $\Delta l$, as illustrated in FIG. 4*b*. This reduces the capacitance of the throat section, thereby raising the impedance.

Any difference in the dielectric constant between the two waveguide materials (e.g. metal oxide and photoresist) further complicates the impedance match. In our example, the source carrier is lead oxide which has a dielectric constant of approximately 26, and the waveguide is a photoresist material with a dielectric constant of about 3, However, for very thin oxide layers (on the order of 15 A.) the dielectric constant of lead oxide is less than 26 due to its nonuniform composition. This greatly improves the possibility of an impedance match between the lead oxide and the photoresist material. In accordance with the present invention, the difference in thickness between the oxide barrier (on the order of 15 A.) and an adjoining photoresist film (commonly about 5,000 A.), a condition illustrated in FIG. 4*a*, is mitigated by the fact that the propagating wave has a certain penetration depth (for lead about 400 A.) into each of the superconductors forming the Josephson barrier and the photoresist film can be made on the order of 1,000 to 2,000 Angstroms thick, so that the situation of FIG. 3 will be approached.

There are presently four recognized Josephson barrier configurations: The first type is the tunneling barrier; it consists of a sandwich of two superconducting metals separated by a very thin dielectric or other nonsuperconducting layer through which electron pairs can tunnel. This weak-coupling limit of the Josephson effect is the best understood so far. The second and third types of Josephson barrier, are the superconducting bridge and the point contact. The superconducting bridge consists of a thin-film superconductor that is divided in half by a very short and a very narrow constriction through which electron pairs are transported by conduction processes. The point contact consists of two bulk superconductors separated by a thin oxide film, which is under an adjustable pressure. This pressure allows the system characteristics to be varied from those of the tunneling barriers to those of superconducting bridges. The fourth type of Josephson barrier is a granular superconductor, which is predicted to exhibit particularly strong AC radiation. In all those modifications, the AC radiation can be propagated in a dielectric medium such as a tailored photoresist film.

The present description of the invention will be directed to, but not so limited, a sandwich configuration which consists of two superconducting metals separated by a very thin dielectric or nonsuperconducting layer. Sandwich-type barriers described in the prior art were fabricated by depositing a superconductor 10, as illustrated in FIGS. 5*a* and 5*b*, as a strip on a dielectric substrate (not shown). The surface of the deposited superconductor 10 is oxidized by exposure of the metal supply to room ambient or to humidity- and pressure-controlled oxygen. This oxidation is a diffusion process which, at room temperature, proceeds slowly to a depth of a few monolayers in a period of about 30 min. The oxide concentration decreases rapidly with distance from the surface, but the shallow diffusion depth hardly permits the application of the complementary error function equation established for deeper diffusions at constant surface-impurity concentration. Several oxygen molecules may also penetrate the lattice and remain there in substitutional or interstitial places. A large number of $O_2$ molecules will remain adsorbed on the surface ($\approx 10^{15}$ /cm.$^2$), ready to continue the diffusion into or reaction with the second Pb layer 14 evaporated after the oxidation process. The only requirement needed for a continuation of the $O_2$ diffusion or the oxide formation is thermal energy, supplied for instance by $kT_{room}$. It is, therefore, not surprising that these thin oxide layers 12 tend to deteriorate during storage at room temperature for prolonged periods (several days).

The techniques and processes employed for fabricating the Josephson barrier, illustrated in FIGS. 5*a* and 5*b*, are well known. The barrier 16 extends across the overlapping of the superconductors 10 and 14 resulting in an interface buildup at the sides which are exposed to an ambient atmosphere and therefore subject to continuing changes or deterioration. More important, it is very difficult to couple a waveguide to the extremely thin barrier without creating the condition illustrated in FIG. 4*a*. Because of the impedance mismatch resulting between this interface and any connecting device, the AC radiation in the barrier 16 is difficult to measure or couple to a utilization device.

In accordance with the present invention, as shown in FIGS. 6*a* and 6*b*, a first superconductor 18 is evaporated on an insulating layer 20 deposited on an insulating substrate (not shown) over a control conductor 22. The purpose of the control conductor 22 will be explained shortly. A second insulating layer 24 is deposited over the superconductor 18 and a window 26 formed therein by a photoresist technique involving photomasks and exposure and developing of the photoresist. The barrier layer 28 is prepared by a glow-discharge oxidation technique. The barriers are made of metal oxides or other material not derived from the superconductive metal. There are many reasons why the glow-discharge technique is so versatile and can be developed into more than one method to produce barriers with stable characteristics. First, the barrier is formed under clean and defined ambient conditions; the gas pressure during discharge can be held at any value between $1\times10^{-4}$ and $1\times10^{-2}$ Torr. Second, the ion current density and the ion energy can be regulated by plasma pressure, geometry (distance between electrodes and/or substrate), and voltage at the electrodes. There are no unique limits to these parameters; the choice only narrows when additional requirements, like preparation of photoresist insulation layers, have to be fulfilled. Third, the exposure time can be varied; and fourth, other parameters such as metal evaporation rate and metal layer thickness are controllable, but less important. Finally, a second superconductor 30 is evaporated onto the insulating layer 24, through the window 26 and in contact with the barrier 28. As shown in FIG. 6*b*, the barrier 28 does not extend to the edges of the superconductor 18 and therefore not exposed to the atmosphere. This minimizes the impedance mismatch between the barrier 28 and the insulating layer 24 which may be used as a radiation waveguide in a manner to be described.

The versatility and significance of high-energy bombardment is even more emphasized if one considers the barrier formation via large inorganic molecules, like lead nitride molecules on P*b* metal, which are too big to diffuse through the P*b* lattice, or large polymerizable organic molecules like KPR.

By application of an external magnetic field, such as one generated by a supercurrent through a control conductor, considerable control can be achieved over the coupling between the two superconductors, due to the influence of the magnetic field on the phase of the electron wave functions in both superconductors. The gradient of the phase $\Phi$ is in the direction of $z$ of the barrier plane and is proportional to the local field $H(z)$:

$$\text{grad}\,\Phi=(2ed/\hbar c)\,H(z) \qquad (14)$$

where $d=\lambda_1+\lambda_2+d'$=the effective thickness of the sheet of flux, with $\lambda_1$ and $\lambda_2$ being the magnetic field penetration depth into the superconductors, and $d'$ = barrier thickness.

The local field H is composed of the self-field of the supercurrent and any applied external field $H_e$ in the plane of the barrier and oriented along the $y$ direction. For a DC bias voltage $V_0$, and an applied magnetic field $H_e$, the phase difference is given by the expression:

$$\Phi=wt-k'z \qquad (15)$$

where $$w=2eV_0/\hbar,$$

and $$k'=2edH_e/\hbar c.$$

This equation contains the spatial variation of the current density $j$ determined by the applied magnetic field, as well as the time variation determined by the voltage across the barrier 28. When, in addition to $V_0$, an AC voltage $v$ is present across the barrier (either applied or induced), the phase difference is modified and now given by the expression:

$$\phi=wt-k'z+\frac{2e}{\hbar}\int^{t}v(t')\,dt' \qquad (16)$$

This additional term in $\Phi$ introduces a DC component in the current density $j(t)$ and gives rise to steps in the I—V characteristic curve.

Another process resulting in the appearance of constant voltage regions (steps) in the I—V characteristic curve is the transfer of microwave radiation into the barrier 28. In the presence of microwave radiation of the same frequency as the AC supercurrents, DC supercurrents (i.e., the transfer of Cooper-pairs across the barrier) can occur, provided the potential difference of the step is such that energy can be conserved by absorption or stimulated emission of a photon. Thus, if the AC radiation from one barrier can be transferred to a second barrier, the frequency in the first barrier will be superimposed upon the radiation in the second barrier, thereby changing the frequency of the second barrier. According to equations (4) and(16), this frequency modulation will show up as a voltage modulation across the second barrier which can be sensed and utilized for computing purposes.

With a superconductive tunneling barrier produced in accordance with the present invention, radiation can be transferred between barriers along a waveguide patterned in the insulating layers used to fabricate the barriers. The radiation between interconnected barriers is transferred at a speed on the order of ½c. (that is, 15 cm./nanoseconds), without the conventional L/R losses.

With respect to the materials to be chosen for arrays of this invention, soda lime glass is preferred as a substrate, but it should be understood that other substrates, for example, flexible substrates such as a Mylar film, can be employed instead of a glass substrate. The superconductive metal is not restricted to lead; other Type-I superconductors can also be used. In addition, Type-II superconductors and superconductive compounds are applicable.

According to FIG. 7, the insulating film 40 is applied over the surface of the lead conductor 34 and substrate 38 by a suitable technique. In accordance with an important aspect of the invention, the insulating film 40 may be a photosensitive material such as that believed adequately described in its various aspects in U.S. Pat. Nos. 2,690,966; 2,732,301; and 2,861,057. The photosensitive material described in the preceding patents is a negative photoresist material that will be polymerized when exposed to ultraviolet light. The unexposed areas of the film are then removed by a simple developing process, using appropriate developing fluids. After the photosensitive material has been applied over the substrate 38 and the array of first superconductors, such as the conductor 34, a photomask is precisely indexed on the substrate and the photoresistant film is exposed to ultraviolet light in all areas except in the barrier regions. Then, the substrate 38 and the lead conductor 34 are immersed in a developer for the photosensitive coating which removes all unexposed portions thereby forming the window 42 in the polymerized insulating film 40.

The tailoring of the waveguide, i.e., a polymer film, can be extended to interconnect several arrays. A flexible connector is covered with a photoresist film or other appropriate waveguide material and waveguide paths are etched in a manner similar to that described above for array connection. Next, the connector film and the arrays are either pressed together mechanically (e.g. by a clamp) or bonded chemically (e.g. by a thermal-compression bonding procedure) such that contacts are formed having reflection-free wave propagation. These connections may be simple enough to allow easy replacement for repair of the arrays. This technique of interconnecting arrays permits single transmission from array to array at the speed comparable to ½c. and without conventional L/R delays. Thus, a unique and efficient array operation for logic and memory purposes will be produced The advantages of this invention are particularly obvious when numerous arrays have to be interconnected and where an easy repair of interconnections has to be possible. Interarray adhesion may be assisted, for example, by stearic acid molecules which can be spread along a cut perpendicular to the sandwich geometry. This type of chemical adhesion is both strong mechanically and easily repaired so that the waveguide can be affixed and removed repeatedly. As shown in FIG. 8, the insulating layer 64 may be tailored to define a waveguide for interconnecting the tunneling barrier 68 with the tunneling barrier 76. FIG. 8 illustrates in three dimensions one section of an array. Typically, the insulating layer 64 and the superconductors 70, 72 and 74 may be on the order of 7,000 Angstroms thick. A barrier may be in the shape of a rectangle 250,000 Angstroms by 750,000 Angstroms.

While only one embodiment of the invention, together with modifications thereof, has been described in detail herein and shown in the accompanying drawings, it will be evident that various further modifications are possible in the arrangement and construction without parting from the scope of the invention.

I claim:

1. A method of interconnecting the energy barriers coupling superconductors in an array comprising:
forming an energy barrier between each pair of superconductors in the array; and
patterning a dielectric material contacting the barriers to outline waveguides for interconnecting said energy barriers with an approximate impedance match between the barriers and the waveguide to transport electromagnetic radiation, particularly that emitted by the energy barrier itself.

2. A method of interconnecting the energy barriers coupling superconductors in an array as set forth in claim 1 wherein the superconductor pairs include Type-I superconductors.

3. A method of interconnecting the energy barriers coupling superconductors in an array as set forth in claim 1 wherein the superconductor pairs include Type-II superconductors.

4. A method of interconnecting the energy barriers coupling superconductors in an array as set forth in claim 1 wherein the energy barriers are insulating layers.

5. A method of interconnecting the energy barriers coupling superconductors in an array as set forth in claim 1 wherein the energy barriers are tin oxide layers.

6. A method of interconnecting the energy barriers coupling superconductors in an array as set forth in claim 1 wherein the energy barriers are organic layers.

7. A method of interconnecting the energy barriers coupling superconductors in an array as set forth in claim 1 wherein the energy barriers are metallic nonsuperconductor layers.

8. A method of interconnecting the energy barriers coupling superconductors in an array as set forth in claim 1 wherein the energy barriers are superconducting bridges.

9. A method of interconnecting the energy barriers coupling superconductors in an array as set forth in claim 1 wherein the energy barriers are pressure contacts.

10. A method of interconnecting the energy barriers coupling superconductors in an array as set forth in claim 1 wherein the energy barriers are granular films.

11. A method of interconnecting superconducting energy barriers of an array comprising:
forming a patterned mask in a dielectric material to define an energy barrier on each superconductor of a first array of superconductors;
producing an energy barrier at each superconductor, said barrier having an approximate impedance match with said mask at points defined by the pattern therein; and
removing portions of said mask to outline waveguides to transport electromagnetic radiation, particularly that emitted by the barrier itself.

12. A method of interconnecting superconducting energy barriers comprising:
forming energy barriers coupling superconductors of an array in a mask of a dielectric material having an approximate impedance match with said barriers and exhibiting the property of transmitting electromagnetic radiation;
patterning said masks to outline waveguides for transmitting electromagnetic radiation from the individual barriers; and
selectively interconnecting said waveguides to propagate radiation between selected barriers.

13. A method of interconnecting superconducting energy barriers as set forth in claim 12 including evaporating said superconductors in separate operations on an insulating substrate.

14. A method of interconnecting superconducting energy barriers as set forth in claim 13 including depositing said mask over the first superconductors of the array prior to evaporating the second superconductors.

15. A method of interconnecting superconducting tunneling barriers of an array comprising:
depositing a first array of lead superconductors on a glass substrate;
forming a patterned mask from a photoresist material over said first array of superconductors;
producing a layer of lead oxide on each superconductor of said first array at points defined by said patterned mask;
depositing a second array of lead superconductors on said patterned mask to produce superconducting tunneling devices with said first array of superconductors; and
removing portions of said mask to outline waveguides for transporting electromagnetic radiation, particularly that emitted by the barrier itself, between selected barriers of said array.

16. A method of interconnecting superconducting tunneling barriers of an array comprising:
evaporating a first metal superconductor onto a glass substrate;
depositing a layer of photoresist material onto said superconductor and glass substrate;
patterning said photoresist layer to define a tunneling barrier on said first superconductor;
forming a barrier of a metal oxide on said first metal superconductor;
evaporating a second metal superconductor onto said photoresist layer and said oxide barrier to form a superconducting tunneling device with said first metal superconductor; and
patterning said photoresist material to define a waveguide for coupling electromagnetic radiation, particularly that emitted by the barrier itself, between several of said superconducting tunneling devices.

17. An array of interconnecting energy barriers coupling superconductors comprising:
an array of energy barriers formed between paris of superconductors in the array; and
a waveguide patterned in a dielectric layer to interconnect said energy barriers with an approximate impedance match between the barrier and the waveguide to transport electromagnetic radiation, particularly that emitted by the energy barrier itself.

18. An array of interconnected energy barriers coupling superconductors as set forth in claim 17 wherein the superconductors are Type-I superconductors.

19. An array of interconnected energy barriers coupling superconductors as set forth in claim 17 wherein the superconductor pairs include Type-II superconductors.

20. An array of interconnected energy barriers coupling superconductors as set forth in claim 17 wherein the energy barriers are insulating layers.

21. An array of interconnected energy barriers coupling superconductors as set forth in claim 17 wherein the energy barriers are tin oxide layers.

22. An array of interconnected energy barriers coupling superconductors as set forth in claim 17 wherein the energy barriers are organic layers.

23. An array of interconnected energy barriers coupling superconductors as set forth in claim 17 wherein the energy barriers are metallic nonsuperconductor layers.

24. An array of interconnected energy barriers coupling superconductors as set forth in claim 17 wherein the energy barriers are superconducting bridges.

25. An array of interconnected energy barriers coupling superconductors as set forth in claim 17 wherein the energy barriers are pressure contacts.

26. An array of interconnected energy barriers coupling superconductors as set forth in claim 17 wherein the energy barriers are granular films.

27. An array of interconnected superconducting tunneling barriers comprising:
an array of insulating layers formed between superconductors at points defined by a patterned mask of a dielectric material having an approximate impedance match with said barriers; and waveguides outlined in said mask by removing portions thereof to couple electromagnetic radiation, particularly that emitted by the barrier itself, between selected barriers of said array.

28. An array of interconnected superconducting tunneling barriers as set forth in claim 27 wherein said insulating barriers are layers of lead oxide between lead superconductors.

29. An array of interconnected superconducting tunneling barriers as set forth in claim 28 wherein the patterned mask comprises a photoresist material.

30. An array of interconnected superconducting tunneling barriers comprising:

a first array of lead superconductors evaporated onto a glass substrate;

a mask of photoresist material deposited over said first array of superconductors and patterned to define barriers at each of said conductors;

a barrier of lead oxide produced on each superconductor of said first array at points defined by said patterned mask;

a second array of lead superconductors evaporated on said patterned mask to produce superconducting tunneling devices with said first array of superconductors; and waveguides for coupling electromagnetic radiation, particularly that emitted by the barrier itself, between selected barriers of said array by removing portions of said mask.

31. An array of interconnected superconducting tunneling barriers as set forth in claim 30 including a control conductor for each barrier of said array for generating magnetic control fields in said barriers.

32. An array of interconnected superconducting tunneling barriers as set forth in claim 31 including means for interconnecting waveguides of one array with waveguides of a second array.